United States Patent
Miyano et al.

[11] Patent Number: 6,136,457
[45] Date of Patent: *Oct. 24, 2000

[54] MANGANESE OXIDE MATERIAL HAVING MNO₃ AS A MATRIX

[75] Inventors: Kenjiro Miyano; Takehito Tanaka; Yoshinori Tokura, all of Tokyo; Yasuhide Tomioka, Tsukuba, all of Japan

[73] Assignees: Agency of Industrial Science and Technology Ministry of International Trade and Industry; Angstrom Technology Partnership, both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/039,251

[22] Filed: Mar. 16, 1998

[30] Foreign Application Priority Data

Mar. 16, 1997 [JP] Japan ..................................... 9-064000

[51] Int. Cl.⁷ .......................... B32B 19/00; H01H 35/00; H01H 47/24; G11C 13/04
[52] U.S. Cl. .......................... 428/693; 428/471; 428/699; 428/701; 428/702; 307/117; 365/109; 365/112; 361/173; 250/206
[58] Field of Search .................................... 428/692, 694, 428/469, 471, 693, 699, 701, 702; 423/592, 593, 635; 501/152; 307/117; 365/112, 109; 361/173; 250/206

[56] References Cited

U.S. PATENT DOCUMENTS

| 5,487,356 | 1/1996 | Li et al. ...................................... 117/99 |
| 5,506,077 | 4/1996 | Koksbang ................................. 429/224 |
| 5,665,664 | 9/1997 | Tomioka et al. ........................ 501/152 |
| 5,792,569 | 8/1998 | Sun et al. ................................ 428/692 |

FOREIGN PATENT DOCUMENTS 0 710 734  5/1996  European Pat. Off. .

OTHER PUBLICATIONS

Kuwahara, H. et al., A First–Order Phase Transition Induced by a Magnetic Field,, Science, vol. 270, pp. 961–963, Nov. 10, 1995.

Tomioka, Y. et al., Magnetic Field Induced Metal–Insulator Phenomena in Pr1–xCaxMnO₃ with Controlled Charge–Ordering Instability, Physical Review B, vol. 53, No. 4, pp. 106–109, 1996.

Tomioka, Y. et al., Anomolous Magnetotransport Properties of Pr1–xCaxMnO₃, Journal of the Physical Society of Japan, vol. 64, No. 10, pp. 3626–3630, Oct. 1995.

M. R. Lees, et al., Physica B, Condensed Matter, vol. 223 and 224, No. 1 to 4, pp. 532 to 534, "Field Induced Insulator–Metal Transition in $Pr_{1-x}Ca_xMnO_3$", Jun. 1996.

V. Kiryukhin, et al., Letters to Nature, vol. 386, pp. 813 to 815, "An X–Ray Induced Insulator–Metal Transition in a Magnetoresistive Manganite", Apr. 24, 1997.

A. Asamitsu, et al., Letters to Nature, vol. 388, pp. 50 to 52, "Current Switching of Resistive States in Magnetoresistive Manganites", Jul. 3, 1997.

Thousandfold Change in Resistivity in Magnetoresistive La–Ca–Mn–O Films; Science, vol. 264, Apr. 15, 1994, pp. 413–415, S. Jin, et al.

Giant Negative Magnetoresistance in Perovskitelike $La_{2/3}Ba_{1/3}MnO_x$ Ferromagnetic Films; The American Physical Society, vol. 71, No. 14, Oct. 4, 1993, pp. 2331–2333, R. von Helmolt, et al.

Magnetoresistance in magnetic manganese oxide with intrinsic antiferromagnetic spin structure; American Instiute of Physics, vol. 63, No. 14, Oct. 4, 1993, pp. 1990–1992, Ken–ichi Chahara, et al.

Primary Examiner—Timothy M. Speer
Assistant Examiner—Stephen Stein
Attorney, Agent, or Firm—Oblon, Spivak, McClelland, Maier & Neustadt, P.C.

[57] ABSTRACT

A manganese oxide material that can be used as a switching device or as a memory device or the like is formed of Mn-based oxide material. The Mn-based oxide material exhibits insulator-to-metal transitions induced by irradiating the material with laser light.

5 Claims, 6 Drawing Sheets

MANGANESE OXIDE MATERIAL HAVING MNO$_3$ AS A MATRIX

BACKGROUND OF THE INVENTION

1. Field of the Invention

The present invention relates to a manganese oxide material having MnO$_3$ as a matrix, that exhibits light-induced insulator-to-metal transition and the accompanying antiferromagnetic-to-ferromagnetic transition and can advantageously be used as a switching device or memory device.

2. Description of the Prior Art

The discovery of high-temperature superconductivity in copper oxides has drawn attention to the spin-charge coupled dynamics of oxides of transition metals. One on which research is being conducted is perovskite type manganese oxide materials that exhibit negative colossal magnetoresistance (CMR).

While there are known many perovskite type oxide materials that exhibit the CMR effect such as for example Pr$_{1-x}$Ca$_x$MnO$_3$, Pr$_{1-x}$(Ca$_1$, Sr)$_x$MnO$_3$ and Nd$_{0.5}$Sr$_{0.5}$MnO$_3$ (Physical Review Letters, vol. 71, page 2331: Applied Physics Letters, vol. 63, page 1990; Science, vol. 264, page 413), in each of these materials the negative CMR effect is insulator-to-metal phase transition induced by application of an external magnetic field. Thus, even when switching or memory devices are formed using such materials, application to electronics-related fields has been difficult.

An object of the present invention is to provide a manganese oxide material exhibiting insulator-to-metal transitions that can be controlled by light.

SUMMARY OF THE INVENTION

In accordance with the present invention, the above object is attained by a manganese oxide material having MnO$_3$, as a matrix, that is an antiferromagnetic insulator transformed, when subjected to light, into a ferromagnetic metal.

A manganese oxide system crystal body may be advantageously used as the manganese oxide material.

In the manganese oxide material of this invention, insulator-to-ferromagnetic metal transition may be induced by irradiation with light such as a laser beam. By constituting a switching device or memory device of the material, the incorporation and operation of the device in existing electronic equipment can be facilitated.

Further features of the invention, its nature and various advantages will be more apparent from the accompanying drawings and following detailed description of the invention.

DESCRIPTION OF THE PREFERRED EMBODIMENT

Figure 1:
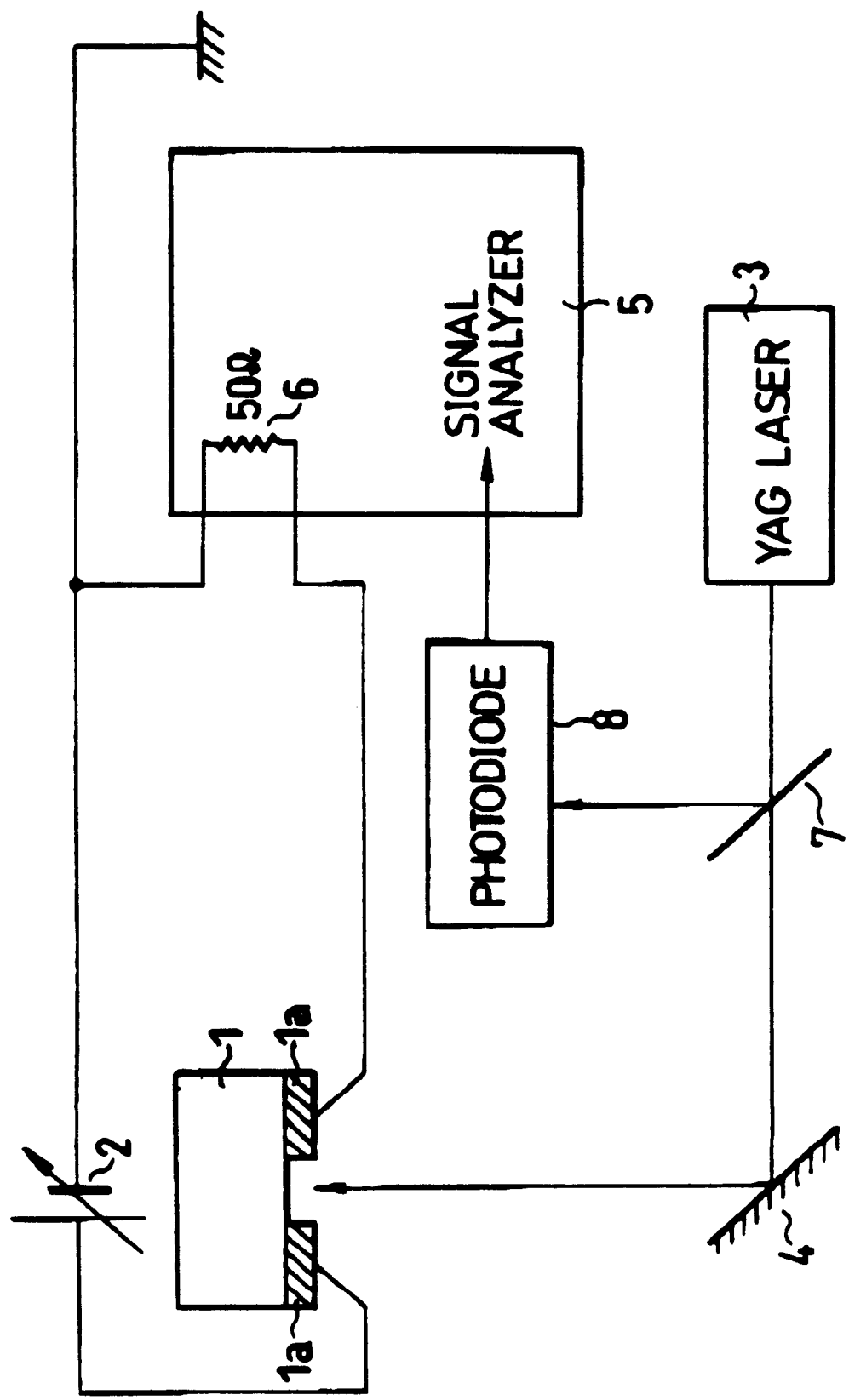
FIG. 1 is a block diagram of the apparatus configuration used to measure light-induced phase transitions in an embodiment according to the present invention.

The present inventors conducted research aimed at finding out if there was any method of inducing insulator-to-metal transitions in MnO$_3$-based manganese oxide system crystal (represented by the general formula R$_{1-x}$A$_x$MnO$_3$ in which R is a rare earth ion and A is an alkaline earth ion) other than by application of a magnetic field, and as a result discovered that the transition could be induced by irradiating the material with a pulsed laser beam. Namely, it was found that a metallic state could be induced by irradiating an antiferromagnetic insulator constituted by perovskite type manganese oxide material. An example of a method that may be used to produce the MnO$_3$-based manganese oxide antiferromagnetic insulator is described below.

In a process used to produce a normal ceramic material (sintered body), oxides of Pr, Ca, Sr and Mn, or compounds that can be substituted for such oxides, are powdered to form a starting mixture. Examples of oxides that may be used include Pr$_6$O$_{11}$, CaO, SrO, and Mn$_3$O$_4$. Examples of compounds that can be heated to substitute for such oxides include carbonates such as Pr$_2$(CO$_3$)$_3$, CaCO$_3$, SrCO$_3$ and Mn(CO$_3$), and acid carbonates such as Pr(HCO$_3$)$_3$, Ca(HCO$_3$)$_2$, Sr(HCO$_3$)$_2$ and Mn(HCO$_3$)$_2$.

The required antifferromagnetic insulator crystal is represented by the general formula R$_{1-x}$A$_x$MnO$_3$. Preparing this necessitates deciding on the requisite elements (R, A) and the quantity represented by x. For example, if R is Pr and A is Ca, an x value within the range 0.3 to 0.75 will provide a crystal forming an antiferromagnetic insulator. While various methods may be used to prepare the mixture, a method that can be advantageously used is that in which a volatile organic solvent such as alcohol or ketone is added. The starting powder mixture is sintered by heating in air at a temperature of 1,000° C. and the sintered body is then pulverized to a fine powder. This is repeated a plurality of times to ensure the components are uniformly mixed. The powder is then press-formed into rods, sintered by being heated in air at 1,100° C., and crystal growth of the sintered body thus obtained is then effected by the floating zone method. This process is preferably carried out in an atmosphere of pure oxygen, and at a crystal growth rate of 3 to 7 mm/h. If required, a binder may be used In the above press-forming step.

The manganese oxide based crystal body thus obtained is subjected to x-ray diffraction analysis, electron-beam microanalysis, ICP mass analysis and titration analysis. The formation of an antiferromagnetic insulator can be confirmed from the temperature dependence of the electrical resistivity and the magnetic susceptibility.

When this antiferomagnetic insulator material is irradiated with light, the irradiated portions undergo a transition to a metallic state. A single laser pulse is sufficient irradiation and, depending on the irradiation conditions, the material can be made to revert to an insulator immediately or after a prescribed time, or made to maintain the metallic state.

In the manganese oxide material according to this invention, laser beam irradiation in used to produce an abrupt change tn electrical resistivity, a novel phase transition method that is utterly unlike the conventional one using application of a magnetic field. The light switching device that utilizes the change in resistance accompanying the light-induced phase transition, as well as the operating principle thereof, and the selective formation of a metallic state through the application of light, can also be used with respect to photolithographic materials and methods.

Moreover, in the light-induced phase transition in the manganese oxide material of the invention, depending on the irradiation conditions used, the metallic state may be maintained even after the light irradiation is terminated following the transition to the metallic state. As such, the material, and the operating principle thereof, may be utilized as an optical memory device in which the insulating state represents "0" and the metallic state represents "1".

As can be understood from the foregoing explanation, the novel insulator-to-metal transition in the manganese oxide material of the present invention is induced by light, unlike the conventional phase transition process in which the phase transition is induced by application of a magnetic field, while achieving the same phase transition.

This phase transition induced by light irradiation is revolutionary unlike that induced by magnetic-field application. The manganese oxide material of this invention can be used as an optical switching device that uses changes in resistivity accompanying light-induced phase transition, and/or as a memory device that utilizes the maintenance of the metallic state. In addition, prescribed portions of the material can be selectively metallized, making it possible to also utilize it as a photolithographical material.

An embodiment of the invention is described below. However, It Is to be understood that the invention is not limited by the embodiment.

Powders of $Pr_6O_{11}$, $CaCO_3$ and $Mn_3O_4$ were mixed to form a Pr:Ca:Mn atomic ratio of 0.7:0.3:1 (corresponding to the general formula $R_{1-x}MnO_3$ in which x=0.3). Ethanol was added and the mixture was stirred for 30 minutes in an agate mortar. The resultant mixture was heated In air at 1,050° C. for 24 hours, pulverized, remixed and again sintered to form a powder mixture. A 2 ton/cm² hydraulic press was then used to press-form the powder into rods measuring 5 mm in diameter and some 80 mm in length, which were sintered by being heated in air for 48 hours at a temperature of 1,100° C.

A floating zone furnace equipped with a pair of halogen incandescent lamps and a hemielliptic shaped focussing mirror were then used to grow crystals on the rods. For this, the rods of the starting material and the seed rods were rotated in opposite directions at a relative speed of 30 to 40 rpm while the crystals were grown at a rate of 3 to 7 mm/h in a stream of 100% oxygen. The central portion of the crystal thus obtained was then cut into thin slices and the surfaces mechanically polished. Vacuum deposition was then used to form gold electrodes 1a on the polished surface of sample 1, with the electrodes spaced 50 μm apart, as shown in FIG. 1. To enable the characteristics of the sample to be measured, gold paste was used to attach gold lines to the electrodes. The sample was heated to 300° C. and maintained at that temperature to remove the gold paste binder and bake the lines onto the sample.

The measurement apparatus shown in FIG. 1 was then used to measure the light-induced phase transition. The sample 1 was positioned for irradiation by pulsed laser beam, using a YAG (yttrium-aluminum-garnet) laser 3 and a mirror 4. A stabilized light source 2 was used to provide a small, direct current bias of a few volts. As shown, to examine the light-induced phase transition, a 50-ohm resistor 6 was provided in an electrically parallel arrangement across the pair of signal input terminals (not shown) of a signal analyzer 5, and the light-induced current was converted to voltage for detection. To obtain a trigger signal to measure the above voltage, a beamsplitter 7 was disposed between YAG laser 3 (having a wavelength of 1.06 μm) and the mirror 4, and a trigger signal was provided to trigger terminals (not shown) of the signal analyzer 5 via a photodiode 8.

Figure 2:
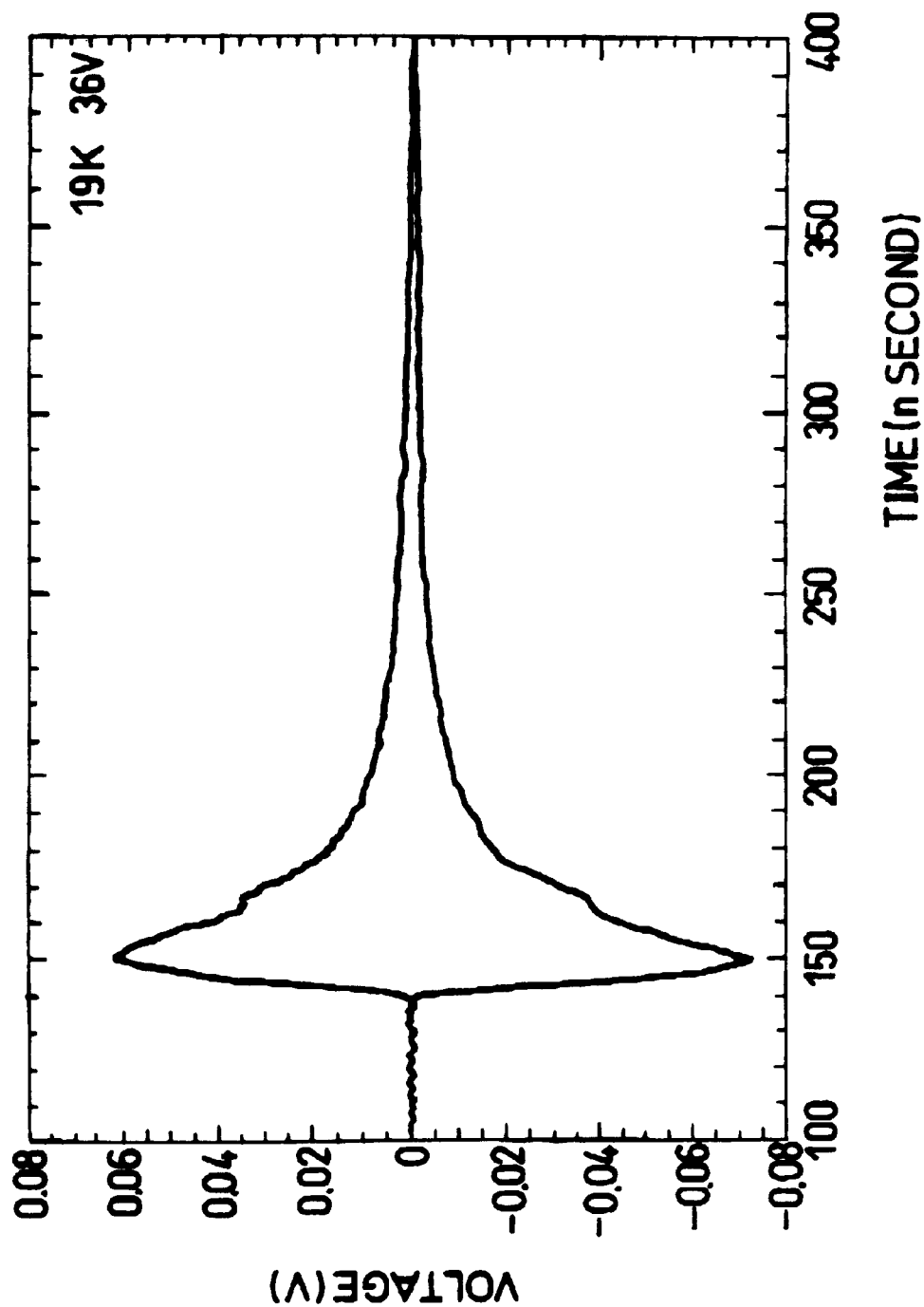
FIG. 2 is a graph showing time-based changes in voltage when a sample of the embodiment of the invention is irradiated with a low-power pulsed laser beam.
Figure 3:
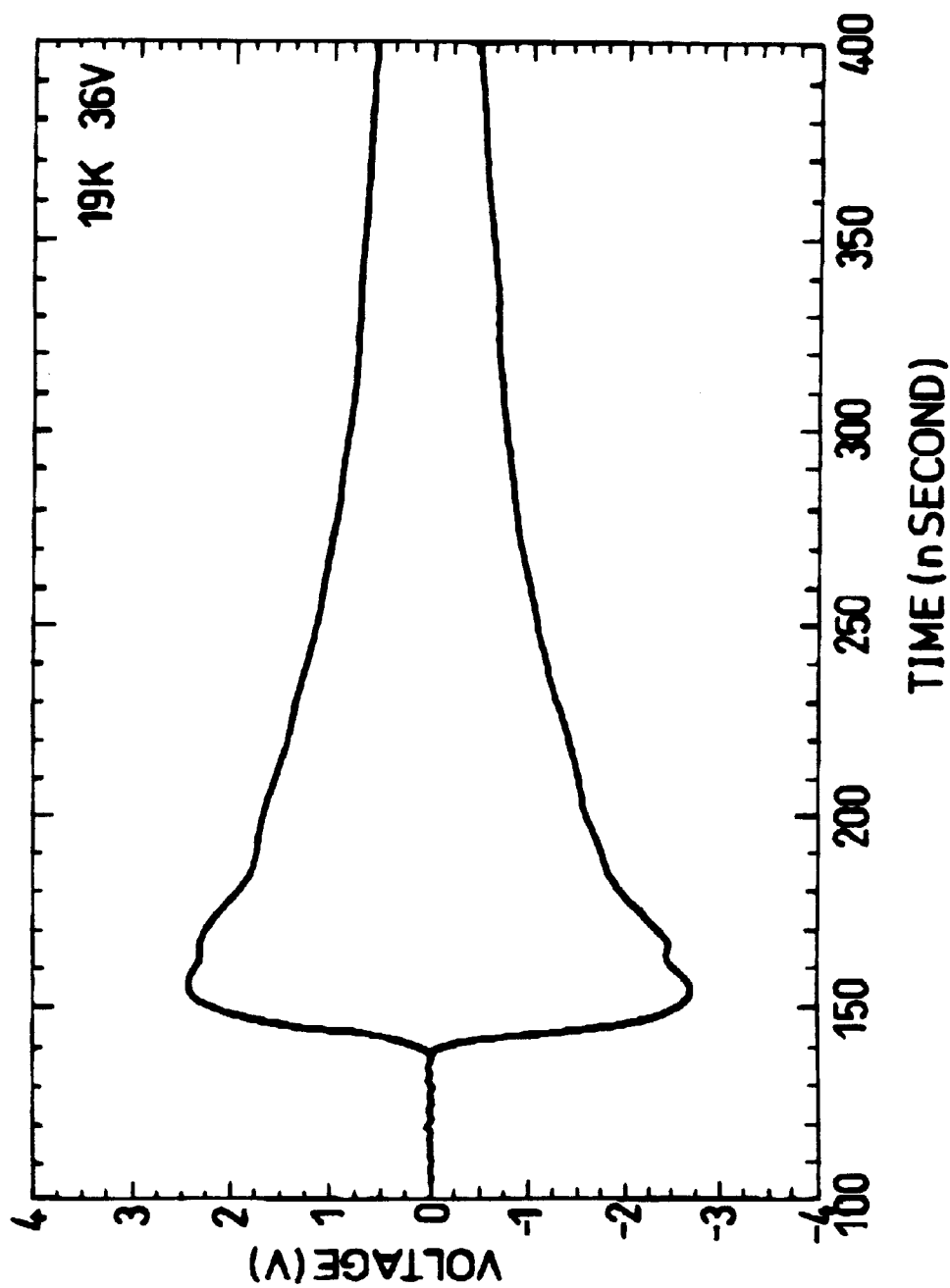
FIG. 3 is a graph showing time-based changes in voltage when a sample of the embodiment of the invention is irradiated with a high-power pulsed laser beam.

FIG. 2 shows voltage changes when the laser 3 was on low power. A 0.5-ns pulse of irradiation by the laser 3 was followed by voltage change in the order of 0.06 V lasting from 140 ns to 150 ns, but as shown, with the passage of time, this attenuated to 200 ns, 300 ns and 400 ns. However, when the power of the laser 3 was increased, as shown in FIG. 3, for the space of 140 ns to 150 ns the change in voltage increased to as much as 2 V and the attenuation was slower than that shown in FIG. 2. meaning that extended electrical conductivity began to be obtained.

Figure 4:
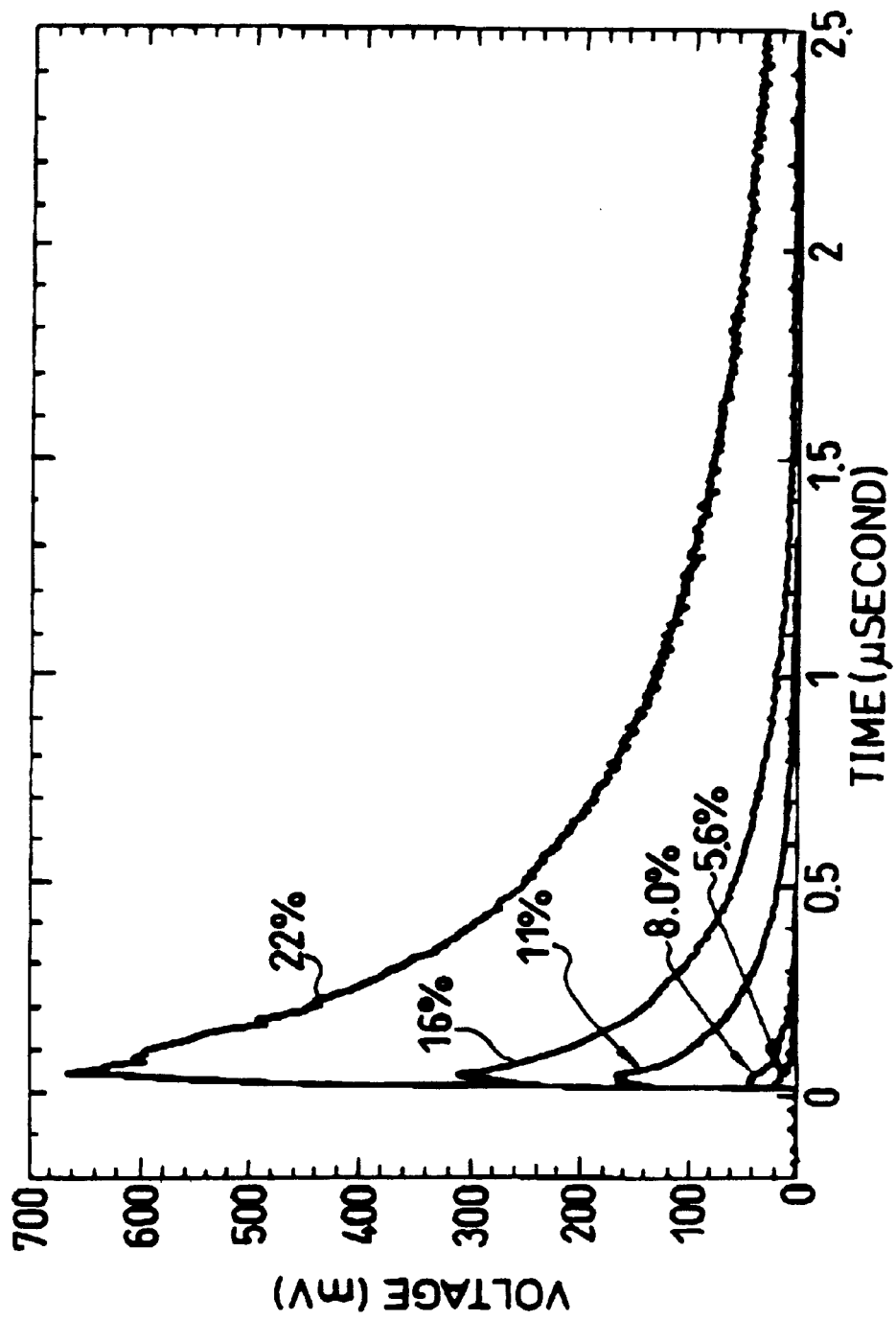
FIG. 4 Is a graph showing time-based changes in voltage when a sample of the embodiment of the invention is irradiated with a pulsed laser beam at a laser power ranging from 0.56% to 22%.
Figure 5:
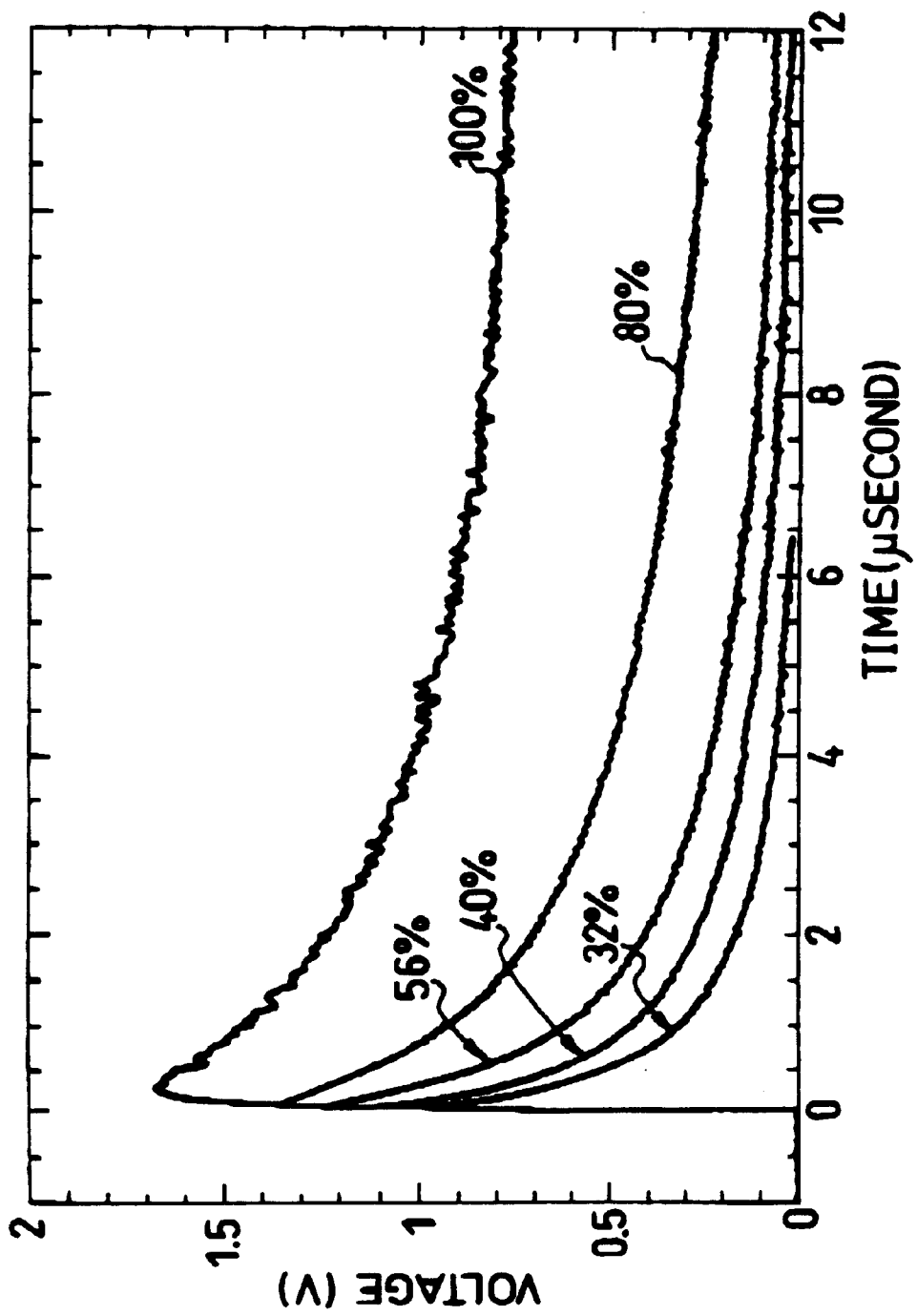
FIG. 5 is a graph showing time-based changes in voltage when a sample of the embodiment of the invention is irradiated with a pulsed laser beam at a laser power ranging from 32% to 100%.

FIGS. 4 and 5 illustrate the pulsed laser beam power dependency of voltage changes. More specifically, FIG. 4 shows voltage changes induced using 5.6% to 22% of the laser power, and FIG. 5 shows the voltage changes induced using 32% to 100% of the laser power. In each case, an increase in the laser power was followed by an increase in the degree of change in the voltage, and the change lasted longer.

Figure 6:
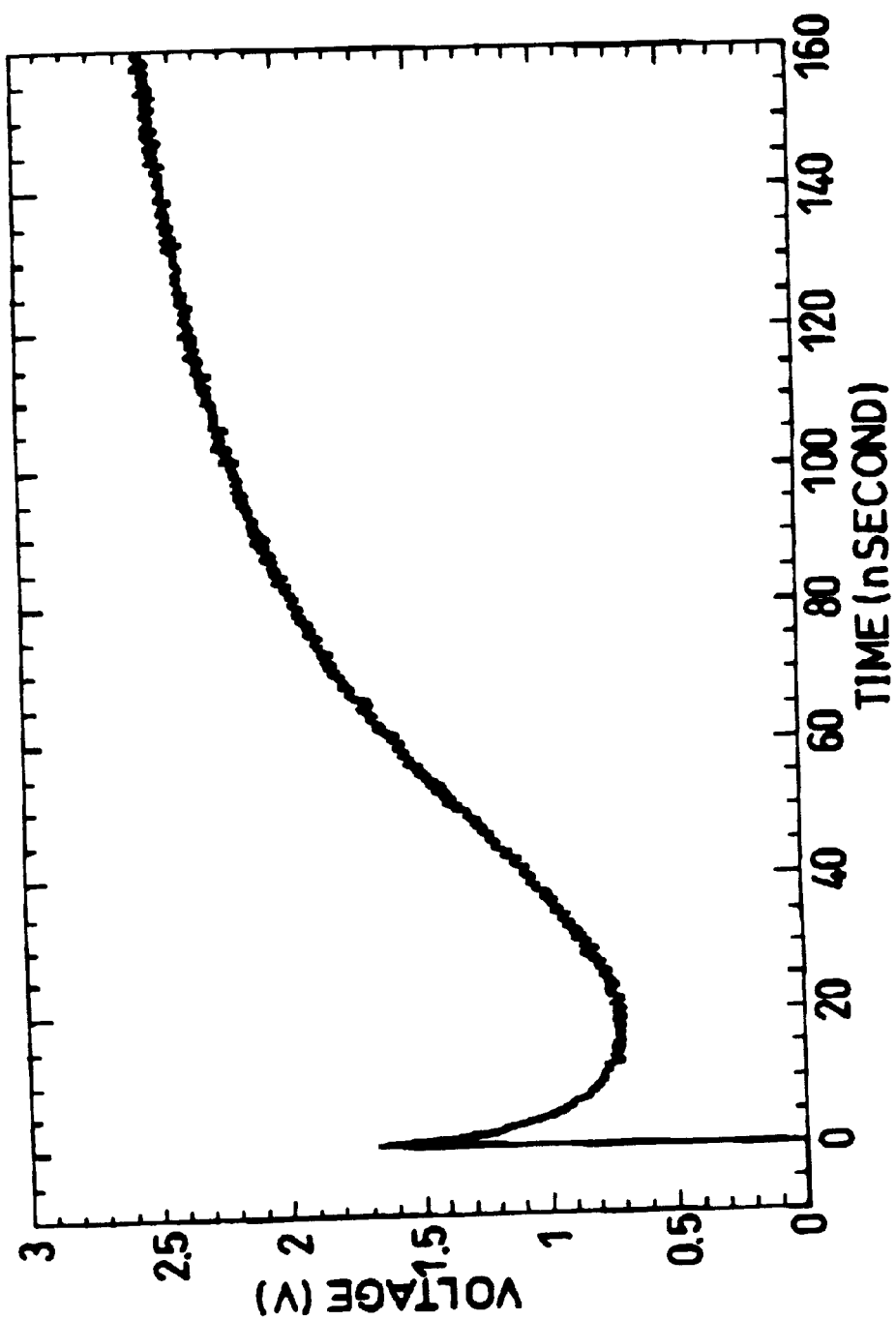
FIG. 6 is a graph showing time-based changes in voltage when a sample of the embodiment of the invention is irradiated with a pulsed laser beam at a laser power of 100%.

FIG. 6 is a graph of voltage change induced using 100% of the power of the laser 3, measured for 100 ns or more. At up to approximately 20 ns attenuation is observed, but after that point the voltage does not decay, but actually starts to increase. This shows that the laser beam irradiation has induced electrical conductivity in the sample 1. That is, it indicates that insulator-to-metal transition has taken place. Measurement over a longer period showed that the change in voltage settled down at approximately 2.8 V. The curve of FIG. 6 was obtained with a direct current bias of 3 V and a laser beam diameter of approximately 50 mm. Assuming a penetration of 0.2 mm into the sample, sample resistivity is in the order of $10^{-4} \Omega$ cm, a typical value for a metal. Thus, the result shown by FIG. 6 reveals that a transition from insulator to metal was induced by the laser beam irradiation.

What is claimed is:

1. A method of switching an electronic device, comprising the step of irradiating with a pulsed laser beam an insulating material of manganese oxide represented by the formula of $R_{1-x}A_xMnO_3$ wherein R denotes a rare earth ion, A denotes an alkaline earth ion, and x is in the range of 0.3 to 0.75, thereby causing a transition of the manganese oxide from an antiferromagnetic insulating state to a ferromagnetic metallic state.

2. A method of imparting a memory capacity to an electronic device, comprising the step of irradiating with a pulsed laser beam an insulating material of manganese oxide represented by the formula of $R_{1-x}A_xMnO_3$ wherein R denotes a rare earth ion, A denotes an alkaline earth ion, and x is in the range of 0.3 to 0.75, thereby causing a transition of the manganese oxide from an antiferromagnetic insulating state to a ferromagnetic metallic state.

3. A light switchable device, comprising a manganese oxide material in an antiferromagnetic insulating state represented by the formula $R_{1-x}A_xMnO_3$, wherein R denotes a rare earth ion, A denotes an alkaline earth ion, and x is in the range of 0.3 to 0.75, a first conductor and a second conductor attached to said manganese oxide material, and a pulsed laser beam light source, wherein upon irradiation with light from said light source, said manganese oxide material is switched from an antiferromagnetic insulating state to a ferromagnetic metallic state, thereby providing a light switchable conductive path from said first conductor, through said manganese oxide material, to said second conductor.

4. The light switchable device of claim 3, wherein said ferromagnetic metallic state is maintained after cessation of light irradiation.

5. The light switchable device of claim 3, wherein said ferromagnetic metallic state reverts to said antiferromagnetic insulating state after cessation of light irradiation.

* * * * *

UNITED STATES PATENT AND TRADEMARK OFFICE
CERTIFICATE OF CORRECTION

PATENT NO. : 6,136,457

DATED : October 24, 2000

INVENTOR(S): Kenjiro Miyano, et al.

It is certified that an error appears in the above-identified patent and that said Letters Patent is hereby corrected as shown below:

On the title page, Item [73], the 1st Assignee's name, and Item [30], the Foreign Application Priority Date are listed incorrectly. Item [73] and Item [30] should read as follows:

[73]   Assignees: Agency of Industrial Science and Technology, Ministry of International Trade and Industry; Angstrom Technology Partnership, both of Tokyo, Japan

[30]   Foreign Application Priority Data

Mar. 18, 1997   [JP]   Japan ..................9-064000

Signed and Sealed this

Eighth Day of May, 2001

NICHOLAS P. GODICI

*Attest:*

*Attesting Officer*   Acting Director of the United States Patent and Trademark Office